(12) United States Patent
Yamaguchi

(10) Patent No.: US 9,088,405 B2
(45) Date of Patent: Jul. 21, 2015

(54) CLOCK PHASE INTERPOLATOR, DATA TRANSMISSION AND RECEPTION CIRCUIT, AND METHOD OF CLOCK PHASE INTERPOLATION

(71) Applicant: FUJITSU LIMITED, Kawasaki-shi, Kanagawa (JP)

(72) Inventor: Hisakatsu Yamaguchi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/203,107

(22) Filed: Mar. 10, 2014

(65) Prior Publication Data

US 2014/0294132 A1    Oct. 2, 2014

(30) Foreign Application Priority Data

Mar. 26, 2013   (JP) ................. 2013-064459

(51) Int. Cl.
*H03D 3/24*    (2006.01)
*H04L 7/033*   (2006.01)
*H03K 5/13*    (2014.01)
*H03L 7/081*   (2006.01)
*H03L 7/089*   (2006.01)

(52) U.S. Cl.
CPC .............. *H04L 7/033* (2013.01); *H03K 5/133* (2013.01); *H03L 7/0814* (2013.01); *H03L 7/0896* (2013.01); *H04L 7/0337* (2013.01)

(58) Field of Classification Search
CPC ...... H03L 7/0896; H04L 7/033; H04L 7/0337
See application file for complete search history.

(56) References Cited

U.S. PATENT DOCUMENTS

| 8,427,217 | B1 * | 4/2013 | Le Grand de Mercey et al. ................ 327/231 |
| 2003/0048863 | A1 * | 3/2003 | Saeki ..................... 375/376 |
| 2009/0179674 | A1 | 7/2009 | Tamura et al. |
| 2013/0108001 | A1 * | 5/2013 | Chang et al. ............ 375/374 |

FOREIGN PATENT DOCUMENTS

JP    2002-123332 A    4/2002

* cited by examiner

*Primary Examiner* — Leon-Viet Nguyen
(74) *Attorney, Agent, or Firm* — Arent Fox LLP

(57) ABSTRACT

A clock phase interpolator includes: a phase interpolation processing circuit configured to generate an interpolated clock signal whose phase is interpolated from a plurality of operation clock signals having different phases; a band adjustment element coupled to the phase interpolation processing circuit, and configured to adjust an operational frequency band of the phase interpolation processing circuit by changing a setting value of itself; and a control circuit coupled to the phase interpolation processing circuit, and configured to detect a transition state for a reference clock signal of the interpolated clock signal, and configured to control the setting value of the band adjustment element on the basis of the detected transition state.

8 Claims, 10 Drawing Sheets

CLOCK PHASE INTERPOLATOR, DATA TRANSMISSION AND RECEPTION CIRCUIT, AND METHOD OF CLOCK PHASE INTERPOLATION

CROSS-REFERENCE TO RELATED APPLICATION

This application is based upon and claims the benefit of priority of the prior Japanese Patent Application No. 2013-064459, filed on Mar. 26, 2013, the entire contents of which are incorporated herein by reference.

FIELD

The embodiments discussed herein are related to a clock phase interpolator and a data transmission and reception circuit.

BACKGROUND

The speed of data transmission and reception circuits which perform data transmission and reception between boards and between cases, data transmission and reception between LSIs, and data transmission and reception between a plurality of elements and circuit blocks in a chip has been increased. Then, a data transmission clock is transmitted with data, a reception clock in a phase suitable for reception of data having the same frequency as that of a transmission clock is generated from a clock received at the reception side by a PLL circuit and the like, and transmission data is received in synchronization with the reception clock.

Furthermore, using a clock phase interpolator (PI), a reception clock in phase suitable for data reception is generated from a plurality of clocks having the same frequency as that of a transmission clock output from a PLL circuit and the like and different phases.

Linearity is an important characteristic of a clock phase interpolator (PI). The linearity of a PI output clock and the operating band thereof are in a tradeoff relationship. In an actual design, in order to improve the linearity, a band limitation is intentionally imposed by adding a fixed load to a clock path, and the like.

The linearity of the PI is dependent on process, voltage, and temperature (PVT), and varies in accordance with a fabrication process, a power supply voltage, and a temperature.

In improving the linearity by a fixed load, the fixed load is added in accordance with a case where the band is narrowed due to the process, voltage, and temperature (PVT) dependency. In this case, in a case where the band which is PVT dependent is wide, the fixed load is not sufficient, and the linearity is degraded. That is, due to PVT fluctuations, the linearity is degraded. Thus, the operating band of the PI is narrowed but, as the operating band is narrowed, the clock amplitude of a PI internal node is reduced, and an operation failure occurs. Therefore, it is not sufficient to merely narrow the band, and the band is desirably set to be an appropriate band in accordance with PVT fluctuations. Japanese Laid-open Patent Publication No. 2002-123332 is a reference document.

SUMMARY

According to an aspect of the invention, a clock phase interpolator includes: a phase interpolation processing circuit configured to generate an interpolated clock signal whose phase is interpolated from a plurality of operation clock signals having different phases; a band adjustment element coupled to the phase interpolation processing circuit, and configured to adjust an operational frequency band of the phase interpolation processing circuit by changing a setting value of itself; and a control circuit coupled to the phase interpolation processing circuit, and configured to detect a transition state for a reference clock signal of the interpolated clock signal, and configured to control the setting value of the band adjustment element on the basis of the detected transition state.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a circuit diagram, and FIG. 1B is an operation timing chart of an input clock and an output clock;

FIG. 2A is a circuit diagram, and FIG. 2B is a graph illustrating linearity when a band is statically changed;

DESCRIPTION OF EMBODIMENTS

Before embodiments are described, a typical clock phase interpolator (PI) will be described.

Figure 1A:
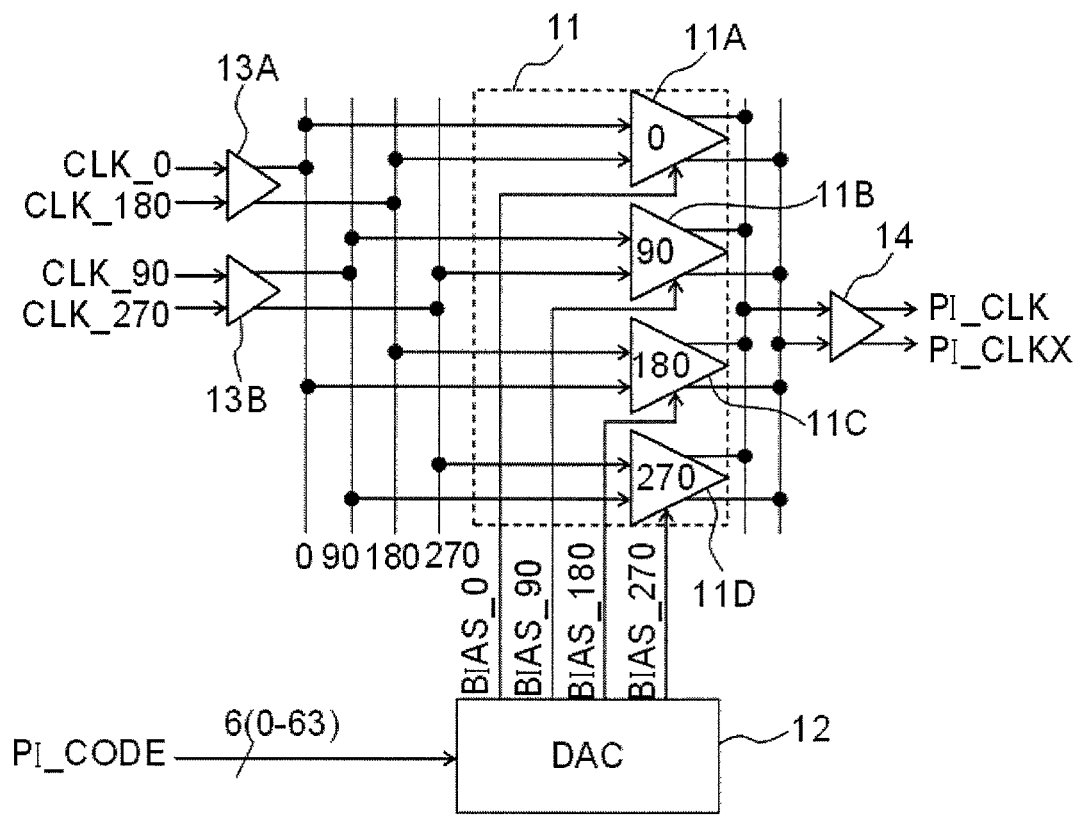
FIGS. 1A and 1B are diagrams illustrating a configuration example of a typical clock phase interpolator (PI) and an operation timing chart.
Figure 1B:
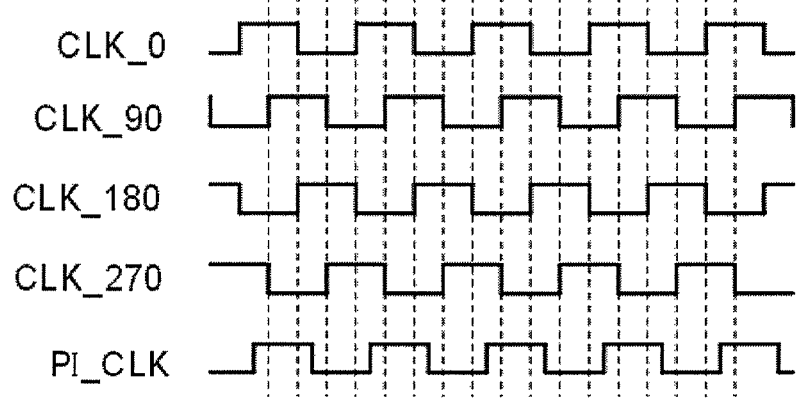

FIGS. 1A and 1B are diagrams illustrating a configuration example of a typical clock phase interpolator (PI) and an operation timing chart, FIG. 1A is a circuit diagram, and FIG. 1B is an operation timing chart of an input clock and an output clock.

The PI is a circuit that generates a clock having a phase between two clocks from two clocks having the same frequency and different phases in accordance with a phase interpolation code (a PI code) by interpolation. The PI of FIGS. 1A and 1B includes four mixers so that the mixers may generate, using clocks having phases that are different from one another by 90 degrees, a clock having a phase between the phases, and generate clocks having phases through out 360 degrees.

As illustrated in FIGS. 1A and 1B, the PI includes clock input buffers 13A and 13B, a mixer 11, a DAC (Digital to Analog Converter) 12, and an output buffer 14. Each of the clock input buffers 13A and 13B receives a corresponding one of pairs of clocks, among four clocks CLK_0, CLK_90, CLK_180, and CLK_270 having different phases with a 90-degree difference between every two of the phases, which are in a reverse phase relationship, uniforms the phases of the received clocks, and outputs the clocks.

The mixer 11 includes four base mixers 11A-11D. The base mixer 11A amplifies the clock CLK_0 and the clock CLK_180 in accordance with a gain control signal BASE_0 transmitted from the DAC 12 and outputs the amplified clocks. The base mixer 11B amplifies the clock CLK_90 and the clock CLK_270 in accordance with a gain control signal BASE_90 transmitted from the DAC 12 and outputs the amplified clocks. The base mixer 11C amplifies the clock CLK_180 and the clock CLK_0 in accordance with a gain control signal BASE_180 transmitted from the DAC 12 and outputs the amplified clocks. The base mixer 11D amplifies the clock CLK_270 and the clock CLK_90 in accordance with a gain control signal BASE_270 transmitted from the DAC 12 and outputs the amplified clocks. Outputs of the base mixers 11A-11D are mutually connected and are input to the output buffer 14.

The DAC 12 generates the gain control signals BASE_0, BASE_90, BASE_180, and BASE_270 in accordance with the PI code (PI_CODE) and outputs the generated signals to the mixer 11. The outputs which have been gain-adjusted by the base mixers 11A-11D are synthesized, and thereby, a signal with an interpolation ratio instructed by the PI code is generated, is shaped by the output buffer 14, and is output.

FIG. 1B illustrates phase clocks when the PI code=8, assuming that the PI code is 6 bits, that is, a 360-degree phase which is one cycle of an input clock may be divided into 64 (=2$^6$). The PI code=8 is "001000" in the 6-bit indication and indicates a 45 degree phase. Then, the DAC 12 causes BASE_0=BASE_90=0.5 and BASE_180=BASE_270=0. Accordingly, the mixer 11 synthesizes the 0-degree phase clock CLK_0 and the 90-degreee phase clock CLK_90 at 1:1 and generates a 45-degree clock PI_CLK by interpolation.

Although FIG. 1A illustrates a differential PI, there are cases where a single ended PI is used.

Linearity is an important characteristic of a clock phase interpolator (PI). The linearity of the PI indicates the manner in which the phase of a PI output clock uniquely varies relative to variations of the PI code and, the closer to equal the interval of change is, the better the linearity becomes. Also, the linearity of the PI output clock and the operating band thereof are in a tradeoff relationship. In an actual design, in order to improve the linearity, a band limitation is intentionally imposed by adding a fixed load to a clock path, and the like.

In improving the linearity by a fixed load, the fixed load is added in accordance with a case where the band is narrowed due to the process, voltage, and temperature (PVT) dependency. In this case, in a case where the band which is PVT dependent is wide, the fixed load is not sufficient, and the linearity is degraded. That is, there has been a problem in which, due to PVT fluctuations, the linearity is degraded.

Figure 2A:
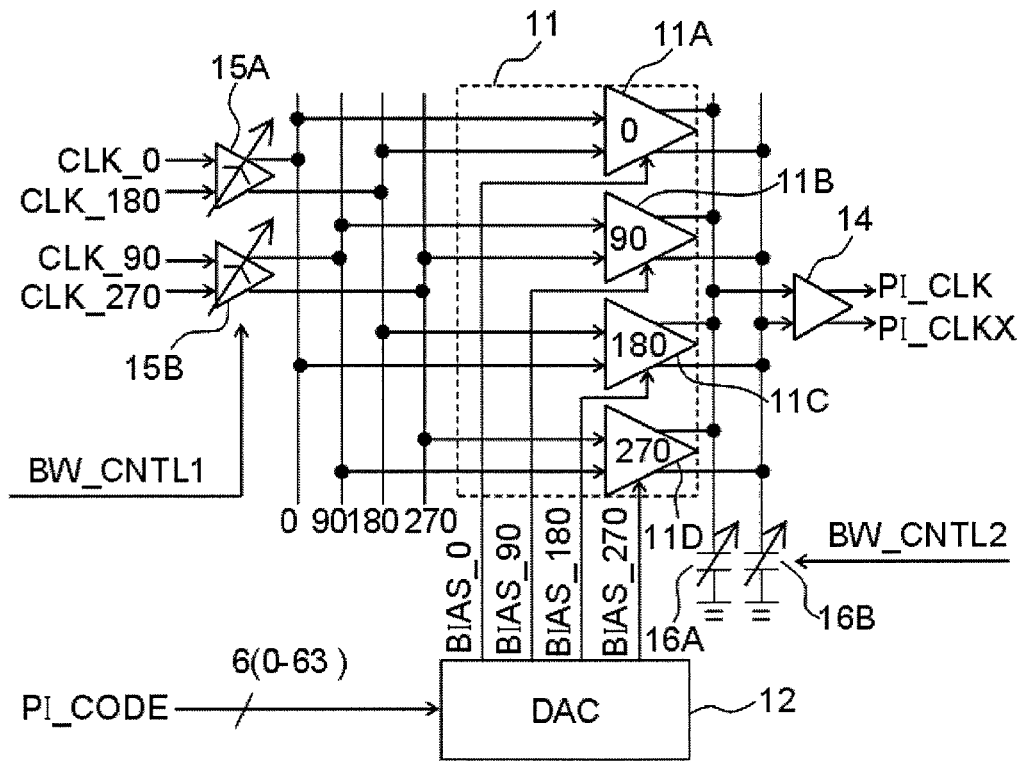
FIGS. 2A and 2B are diagrams illustrating a PI to which a band limitation element is added.
Figure 2B:
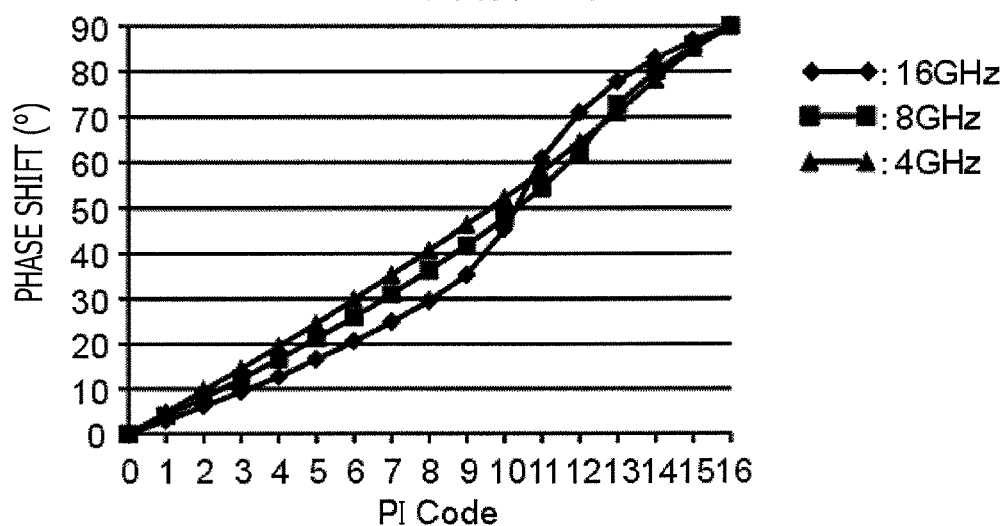

FIGS. 2A and 2B are diagrams illustrating a PI to which a band limitation element is added, FIG. 2A is a circuit diagram, and FIG. 2B is a graph illustrating linearity when a band is statically changed.

The PI illustrated in FIG. 2A is obtained by adding, in the PI illustrated in FIG. 1A, variable capacities 16A and 16B to the outputs of the mixer 11 and replacing the clock input buffers 13A and 13B with clock input buffers 15A and 15B which are capable of band adjustment.

FIG. 2B illustrates the relationship between the linearity and the band for the PI whose operating frequency is 16 GHz. FIG. 2B illustrates the linearity for the cases where the band is statically changed to 16 GHz, 8 GHz, and 4 GHz. As understood from FIG. 2B, as the band is narrowed, the linearity is improved. Conventionally, the fixed load is added in accordance with the case where the band is narrowed due to the PVT dependency.

However, as the band is narrowed, the clock amplitude of the PI internal node is reduced, and an operation failure occurs. Therefore, it is not sufficient to merely narrow the band, and the band is desirably set to be an appropriate band in accordance with PVT fluctuations. But, this is not realized in a configuration in which a fixed load is added to a clock path, and the like, as in the PI illustrated in FIG. 2A.

In a PI according to one of the following embodiments, the operating band of the PI is adjusted, in accordance with PVT fluctuations, so as to be a requisite minimum band. Accordingly, the linearity is improved. In other words, in a semiconductor device in which a PI is mounted, the band of the PI is automatically adjusted in a field.

Band adjustment for the PI according to the embodiment is performed such that a requisite minimum band in which transitions (changes between 0 and 1) of PI output clocks PI_CLK and PI_CLKX exist. Thus, the operating band is dynamically (automatically) adjusted such that appropriate transitions of the PI output clocks PI_CLK and PI_CLKX are at the boundary between the existence and the absence of transition.

Figure 3:
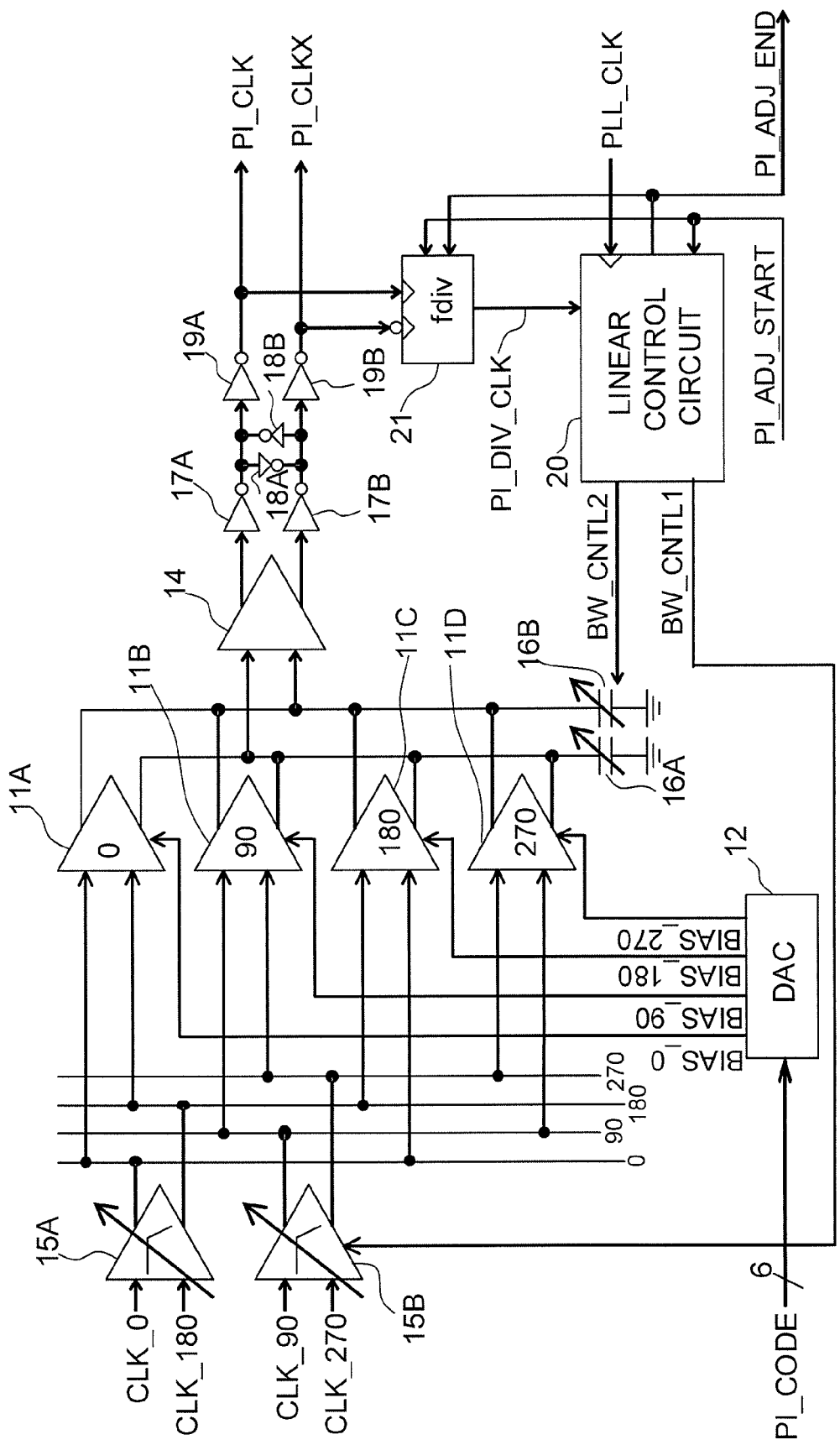
FIG. 3 is a circuit diagram of a clock phase interpolator (PI) according to a first embodiment.

FIG. 3 is a circuit diagram of a clock phase interpolator (PI) according to a first embodiment.

The PI according to the first embodiment includes clock input buffers 15A and 15B that are capable of band adjustment, a mixer, a DAC 12, an output buffer 14, variable capacities 16A and 16B, an output shaping circuit, a linear control circuit 20, and a frequency divider 21.

Figure 4:
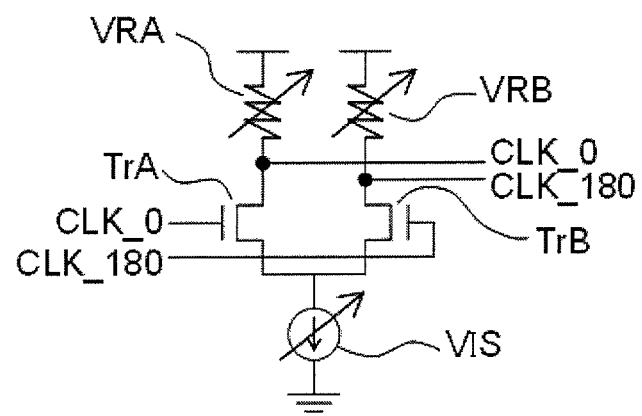
FIG. 4 is a circuit diagram of a clock input buffer which is capable of band adjustment.

FIG. 4 is a circuit diagram of a clock input buffer 15A which is capable of band adjustment. The clock input buffer 15A is a differential amplifier and includes a pair of transistors TrA and TrB, variable load resistances VRA and VRB, and a variable current source VIS. The current amount of the variable current source VIS and the resistance value of the variable load resistances VRA and VRB are set, for example, such that the current amount of the variable current source VIS is halved and the resistance value of the variable load resistances VRA and VRB is doubled, and thereby the band may be adjusted to be halved without changing an output center voltage level of the clock input buffer 15A. The clock input buffer 15B has a similar configuration thereto.

The mixer includes base mixers 11A-11D. The variable capacities 16A and 16B are adjusted to thereby change characteristics of output, thus changing the band of the PI. The variable capacities 16A and 16B are realized, for example, by providing a plurality of pairs of a capacity formed between a node at which the source and drain of a transistor are connected to each other and the gate thereof and a switch formed of a transistor and controlling the number of connected capacities. Also, the variable capacities 16A and 16B may be realized using a varactor provided in the semiconductor device.

As clearly understood from comparison with FIG. 2A, the PI according to the first embodiment has a configuration in which the output shaping circuit, the linear control circuit 20, and the frequency divider 21 are added to the PI of FIG. 2A.

The output shaping circuit includes buffers (inverters) 17A and 17B each of which receives as an input a differential output of the output buffer 14 and buffers 19A and 19B each of which receives as an input an output of the corresponding one of the buffers 17A and 17B. The output shaping circuit further includes two inverters 18A and 18B which connect a node of the buffers 17A and 19A and a node of the buffer 17B and the buffer 19B to each other. The output shaping circuit is configured to match transition timings of a rising edge of one of differential clock signals and a falling edge of the other of the differential clock signals using the inverters 18A and 18B.

The frequency divider 21 frequency-divides the PI outputs PI_CLK and PI_CLKX to generate a clock PI_DIV_CLK which has been frequency-divided to the half of the frequency of a reference clock PLL_CLK. For example, when the frequency of the reference clock PLL_CLK is 2 GHz, the frequency of the clock PI_DIV_CLK is 1 GHz. The reference clock PLL_CLK is a clock obtained by frequency-dividing a clock generated by a PLL circuit (not illustrated).

The clock PI_DIV_CLK and the reference clock PLL_CLK are input to the linear control circuit 20, and it is confirmed that the clock PI_DIV_CLK is appropriately changed to "1010" at each rising edge of the reference clock PLL_CLK. The linear control circuit 20 changes band adjustment codes BW_CNTL1 and BW_CNTL2 to narrow the band of the clock path each time the above-described change is confirmed. Also, at the point of time at which the change to "1010" is not confirmed, each of the band adjustment codes are returned to be the corresponding previous band adjustment code and the code is held. At this point of time, the PI is adjusted such that the band is narrowed to the minimum band within a range in which an operation failure does not occur and the linearity is in a best state. The linearity may be improved in a state where PVT fluctuations of the transmission and reception circuit are reflected by performing this band adjustment in a state where the transmission and reception circuit using the PI is operated. That is, in the PI according to the first embodiment, the above-described problem is solved. Note that an element which is adjusted using the band adjustment codes and changes the band is referred to as a "band adjustment element". Therefore, in this case, the variable load resistances VRA and VRB in FIG. 4 and the variable capacities 16A and 16B in FIG. 3 are band adjustment elements.

Figure 5:
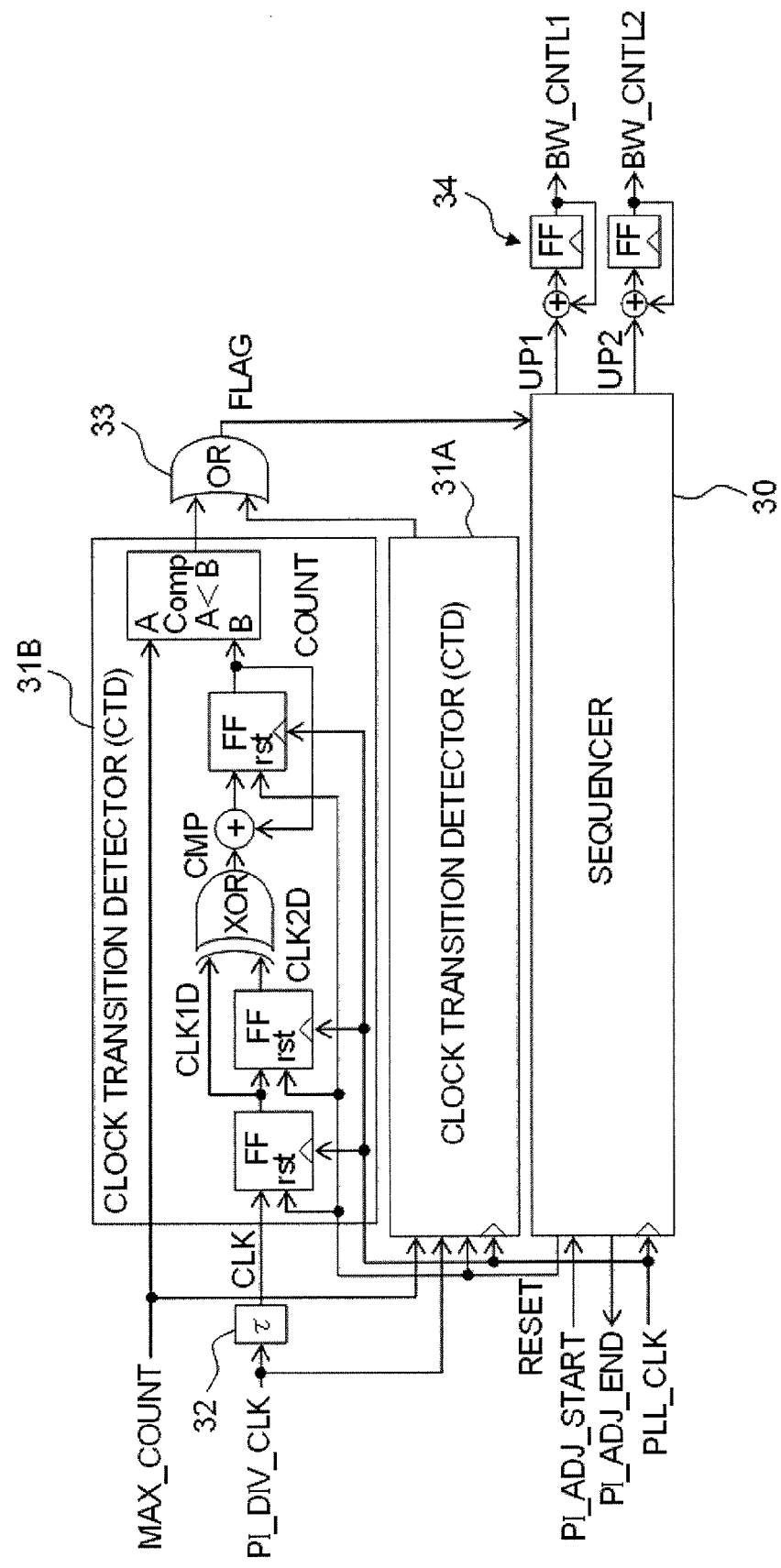
FIG. 5 is a diagram illustrating a circuit configuration of a linear control circuit.

FIG. 5 is a diagram illustrating a circuit configuration of the linear control circuit 20.

The linear control circuit 20 includes a sequencer 30, two clock transition detectors (CTDs) 31A and 31B, a delay circuit (τ) 32, an OR gate 33, and a band adjustment code holding section 34. Although the CTD 31A and the CTD 31B have the same circuit configuration, the clock PI_DIV_CLK which has been delayed by the delay circuit 32 is input to the CTD 31B while the clock PI_DIV_CLK is input as it is to the CTD 31A. The circuit configuration of the CTD 31A and the CTD 31B is as illustrated in FIG. 5. The operation of the linear control circuit 20 will be hereinafter described.

The linear control circuit 20 of FIG. 5 is assumed to be operated in a low frequency domain (an operation frequency region) (that is, similar to the reference clock PLL_CLK, the 2 GHz domain in this case) in view of low power consumption. The sequencer 30 receives an operation start signal PI_ADJ_START=1 from a logic section (not illustrated) which controls the transmission and reception circuit in which the PI is mounted to start a series of operations. Also, the sequencer 30 generates, at the point of time at which band adjustment is completed, an operation end signal PI_ADJ_END=1, and transmits the signal to inform the logic section which controls the transmission and reception circuit of the completion of the operation.

As described above, it is confirmed that the clock PI_DIV_CLK changes to "1010" at each rising edge of the reference clock PLL_CLK but, when the transition timing of the reference clock PLL_CLK overlaps with the transition timing of the clock PI_DIV_CLK, the transition of the clock PI_DIV_CLK is not correctly detected. Therefore, the linear control circuit 20 includes the two CTDs 31A and 31B and the delay circuit 32 that generates a clock CLK obtained by delaying the clock PI_DIV_CLK by τ.

Figure 6:
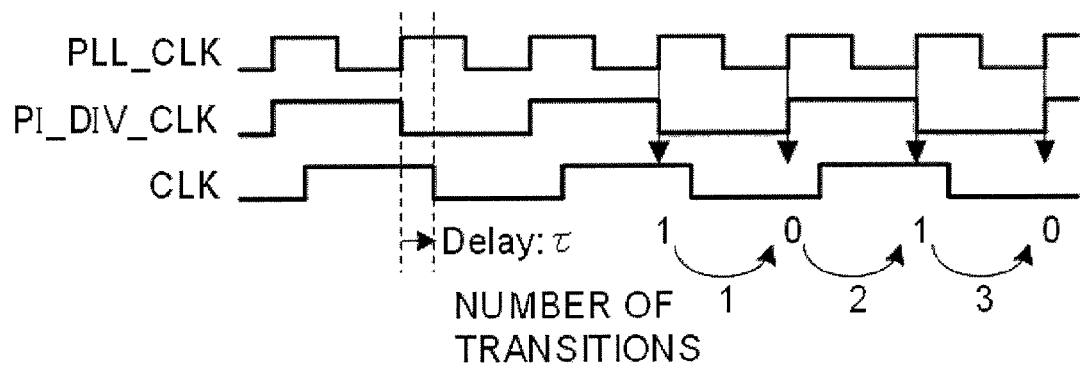
FIG. 6 is a timing chart of the operation performed in CTD.

FIG. 6 is a timing chart of the operation performed in the CTDs 31A and 31B.

The CTD 31A confirms that the clock PI_DIV_CLK changes to "1010" at each rising edge of the reference clock PLL_CLK, and the CTD 31B confirms that the clock CLK delayed by τ changes to "1010" at each rising edge of the reference clock PLL_CLK. Specifically, the CTD 31A and the CTD 31B detect, during a set certain period, whether or not the values of the clock PI_DIV_CLK and the clock CLK latched at rising edges of the reference clock PLL_CLK are alternately transitioned. Then, the number of transitions during a certain period and, if a count value is greater than a setting value MAX_COUNT, it is determined that the PI output clock is correctly frequency-divided and an appropriate transition exists.

A logical sum (OR) of the outputs of the two CTDs 31A and 31B is operated. When an operation result is FLAG=1, the band adjustment codes BW_CNTL1 and BW_CNTL2 are sequentially incremented (increased), and narrowing the band of the clock path of the PI is performed. Since the PI itself is a linear system, wherever in the clock path related to interpolation a band limitation is imposed, the same effect is achieved. The increment operation of the band adjustment codes BW_CNTL1 and BW_CNTL2 may be performed such that the band adjustment codes BW_CNTL1 and BW_CNTL2 are alternately incremented. Also, the increment operation of the band adjustment codes BW_CNTL1 and BW_CNTL2 may be performed such that the band adjustment code BW_CNTL1 is incremented and, after the upper limit code is reached, the band adjustment code BW_CNTL2 is subsequently incremented. As a matter of course, it is needles to say that the increment operation of the band adjustment codes BW_CNTL1 and BW_CNTL2 may be performed in reverse order.

Figure 7:
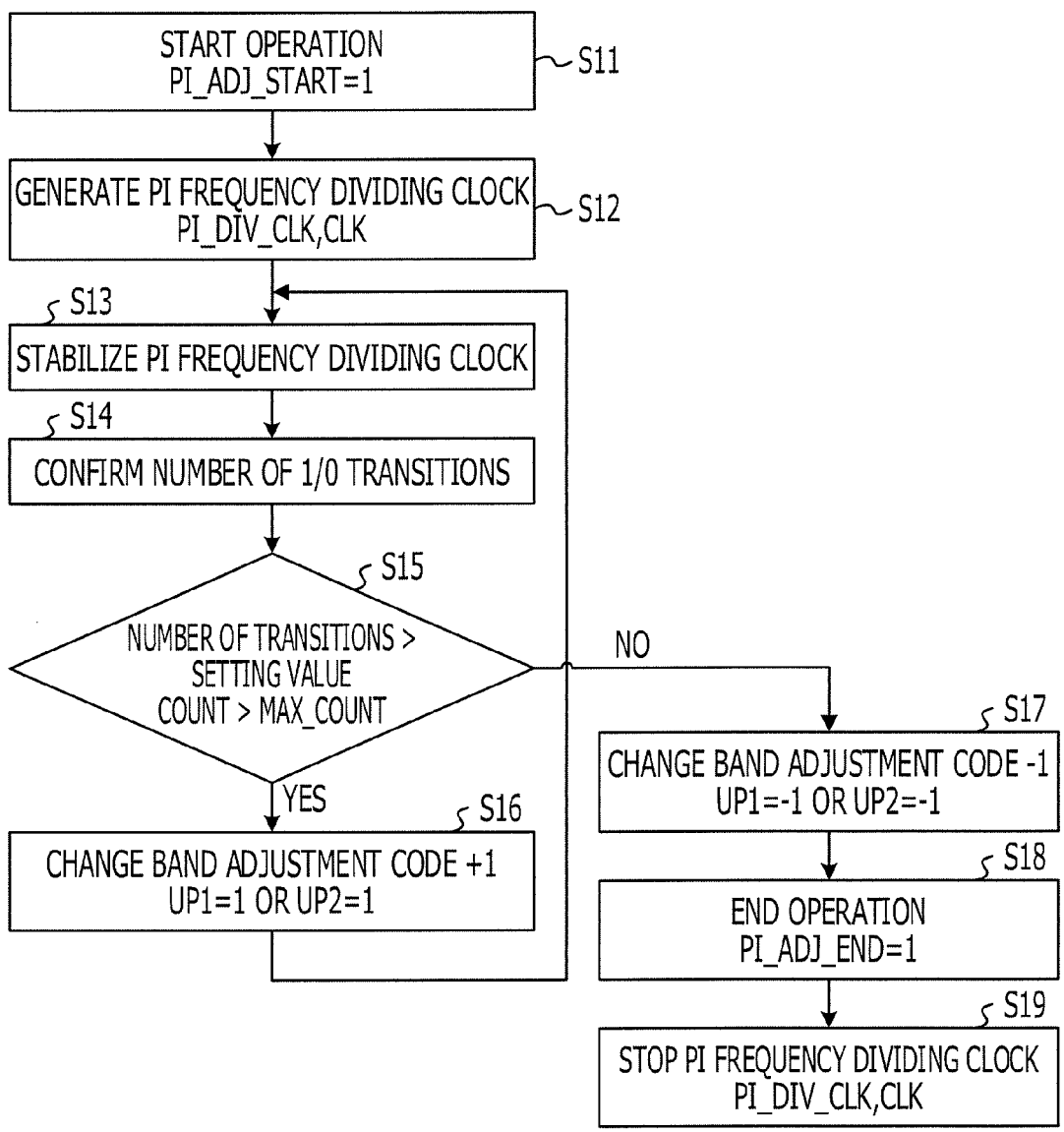
FIG. 7 is a flowchart illustrating a control flow in the PI according to the first embodiment.
Figure 8:
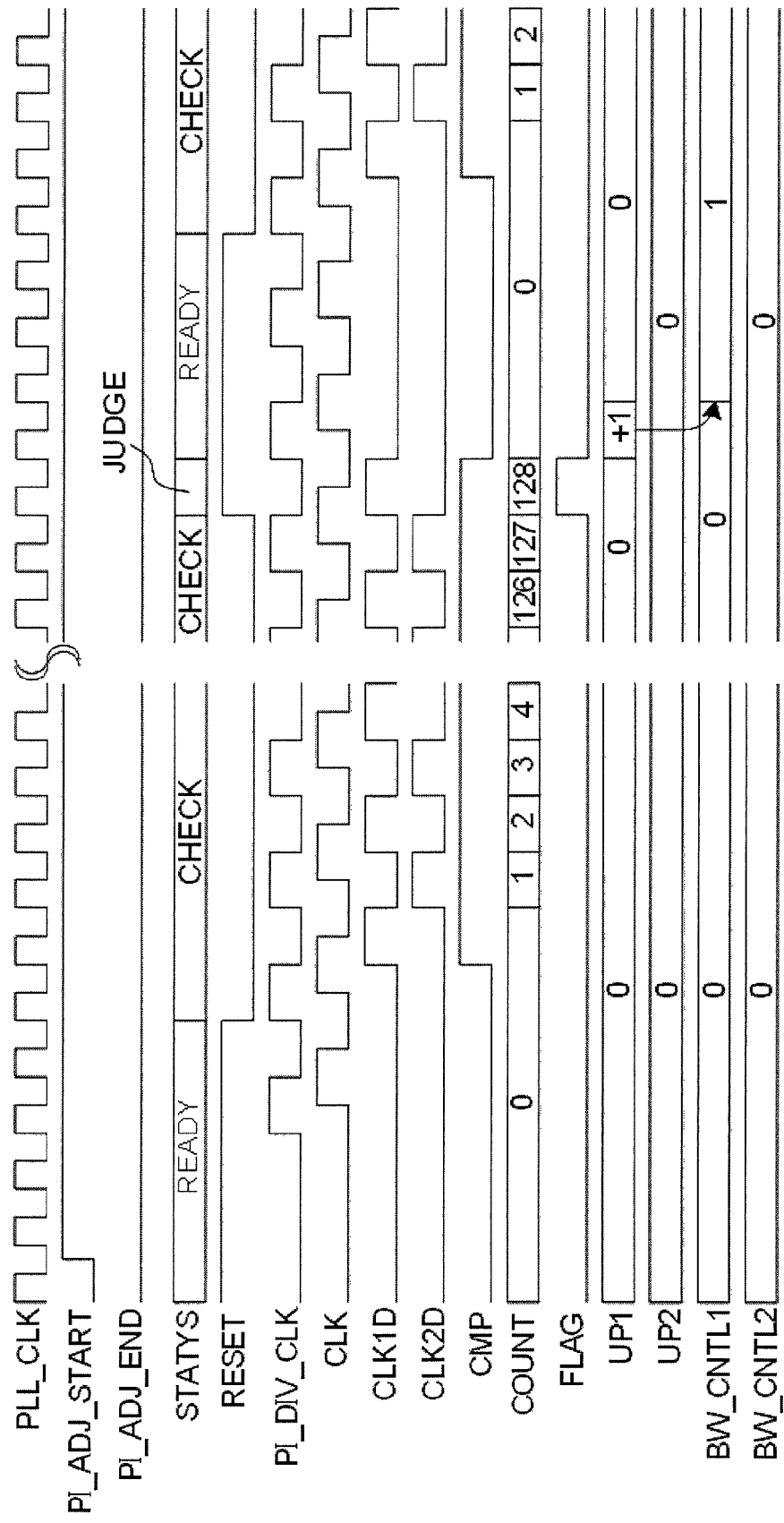
FIG. 8 is a timing chart in a PI.
Figure 9:
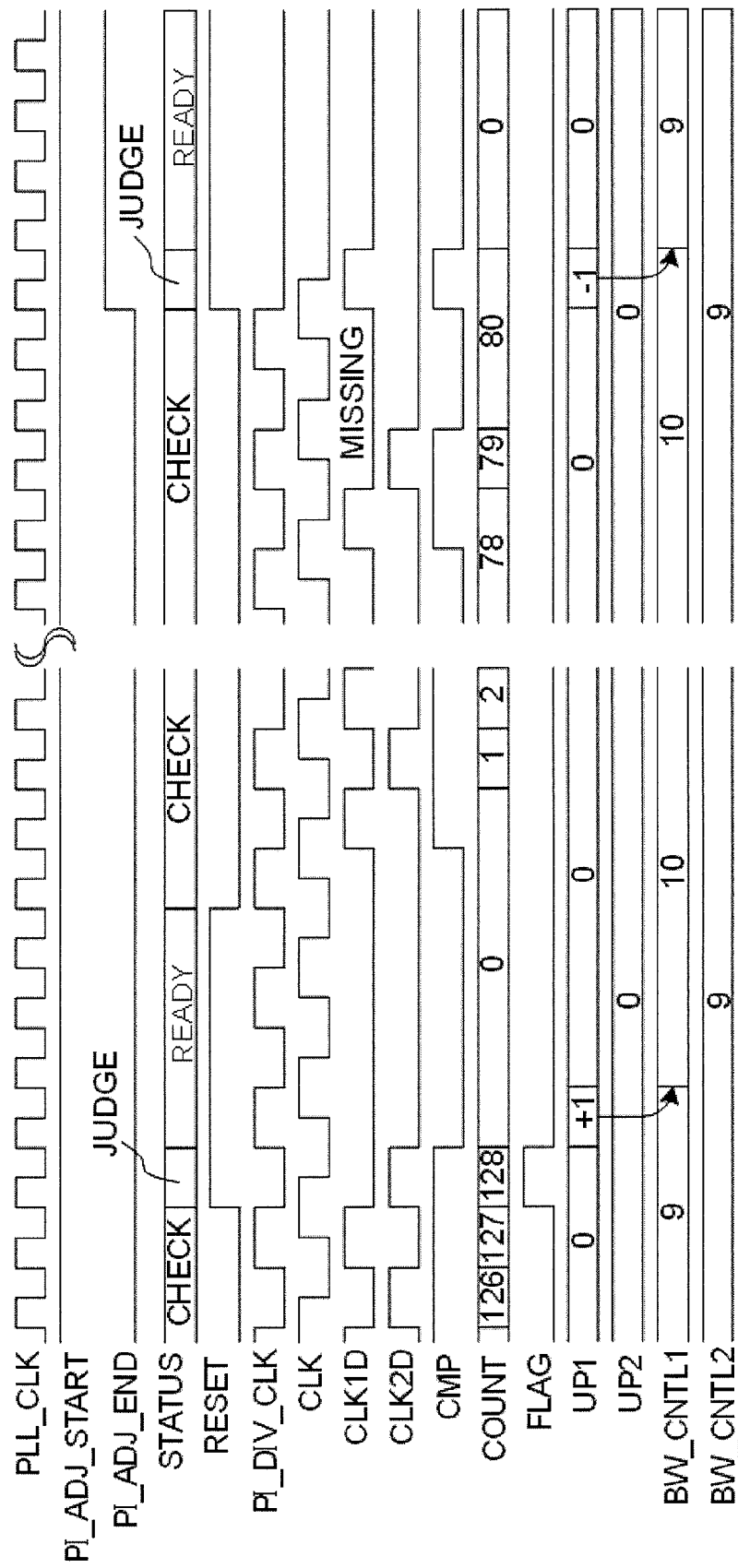
FIG. 9 is a timing chart in a PI.

FIG. 7 is a flowchart illustrating a control flow in the PI according to the first embodiment. FIG. 8 and FIG. 9 are timing charts of the control flow.

In Step S11, an operation start signal PI_ADJ_START=1 is externally set and an adjustment sequence is started. The left side of FIG. 8 illustrates this state.

In Step S12, the frequency divider 21 is started to obtain a state where the clock PI_DIV_CLK, which is a PI frequency dividing clock signal and the clock CLK are generated.

In Step S13, a standby state is kept until the PI frequency dividing clock is stabilized and, when the PI frequency dividing clock is stabilized, the process proceeds to Step S14. "Ready" on the left side of FIG. 8 indicates this state and, after the PI frequency dividing clock is stabled, the state is changed to a "check" state.

In Step S14, it is confirmed whether or not the clock PI_DIV_CLK or the clock CLK has been changed to "1010" at each rising edge of the reference clock PLL_CLK. The left side of FIG. 8 illustrates this state, and a count value "COUNT" of the number of transitions is sequentially increased.

In Step S15, it is determined whether or not the count value "COUNT" of the number of transitions in a predetermined period (128 cycles) is greater than MAX_COUNT (126 in this case). If the count value "COUNT" is greater than MAX_COUNT, the process proceeds to Step S16 and, if the count value "COUNT" is equal to or less than MAX_COUNT, the process proceeds to Step S17. The right side of FIG. 8 and the left side of FIG. 9 illustrate the case where the count value "COUNT" is greater than MAX_COUNT. The case where the count value "COUNT" is less than MAX_COUNT will be described later.

In Step S16, in order to increment (+1) the band adjustment code BW_CNTL1 or the band adjustment code BW_CNTL2, 1 is output to UP1 or UP2. Accordingly, the band adjustment code holding section 34 increments the band adjustment code BW_CNTL1 or the band adjustment code BW_CNTL2 and holds the incremented value.

The right side of FIG. 9 illustrates a state where it is determined in Step S15 that the count value "COUNT" is equal to or less than MAX_COUNT. Since the band has been narrowed too much, the amplitudes of the PI outputs PI_CLK and PI_CLKX have become too small and, when being frequency-divided, the PI outputs PI_CLK and PI_CLKX are not accurately frequency-divided for each cycle, so that the clock PI_DIV_CLK or the clock CLK does not change in a certain cycle. Therefore, CKL1D and CLK2D obtained by latching the clock PI_DIV_CLK and the clock CLK at rising edges of the reference clock PLL_CLK do not normally change, an error occurs in the count value "COUNT", and MAX_COUNT is not reached. This is because the band has been narrowed too much.

In Step S17, in order to decrement (−1) the band adjustment code BW_CNTL1 or the band adjustment code BW_CNTL2 such that the band adjustment code BW_CNTL1 or the band adjustment code BW_CNTL2 is returned to the previous state, −1 is output to UP1 or UP2. Accordingly, the band adjustment code holding section 34 decrements the band adjustment code BW_CNTL1 or the band adjustment code BW_CNTL2 and holds the decremented value. In this state, the band has been narrowed to the minimum band within the range where an operation failure of the PI does not occur, and the linearity is in a best state.

In Step S18, the operation end signal PI_ADJ_END=1 is generated and the band adjustment operation is ended.

In Step S19, the operation of the frequency divider 21 is stopped. The frequency divider 21 consumes a large amount of power in order to operate at high speed, and therefore, it is preferable to stop the operation of the frequency divider 21 when not being used.

As described above, the clock phase interpolator (PI) according to the first embodiment is adjusted such that the band is narrowed to the minimum within the range where an operation failure does not occur and the linearity is in a best state. Therefore, by performing this band adjustment in a state where the transmission and reception circuit using the PI is operated, the linearity is improved in a state where PVT fluctuations of the transmission and reception circuit are reflected.

Figure 10:
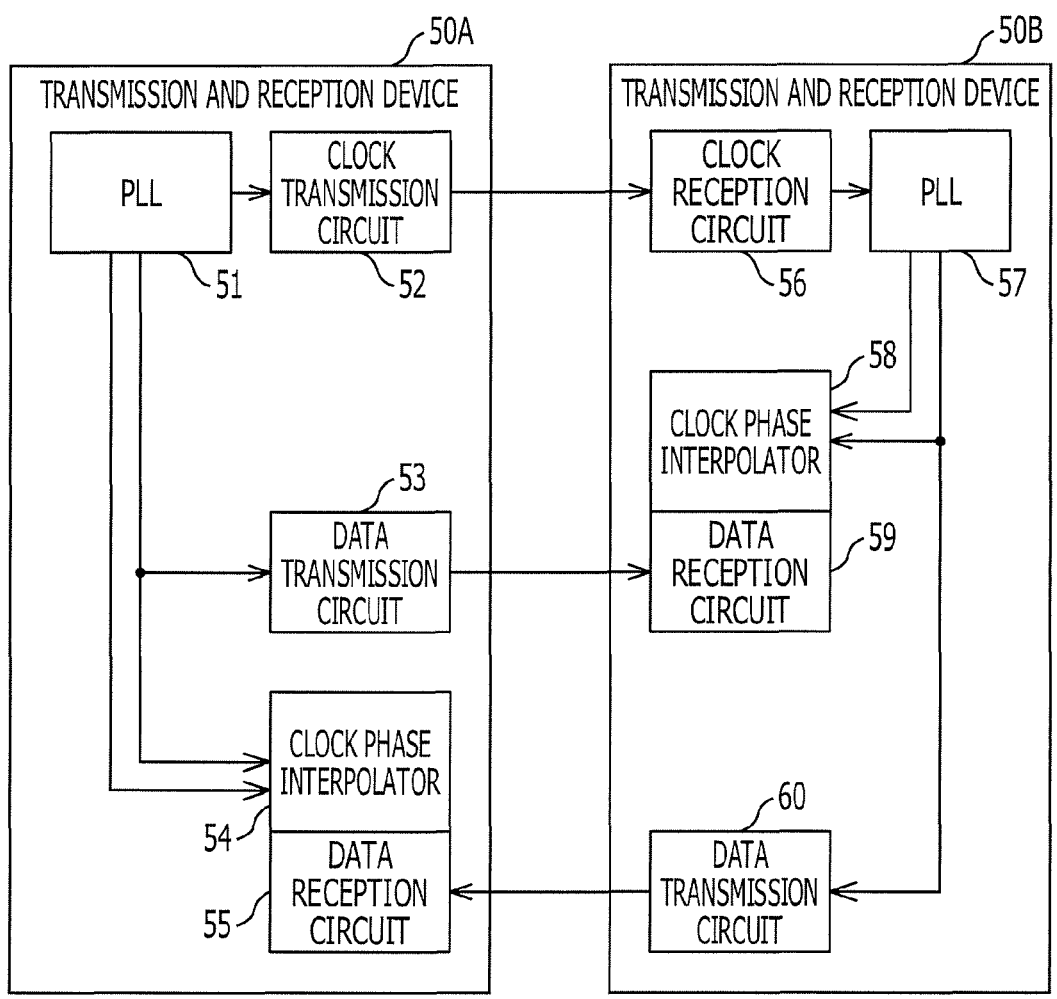
FIG. 10 is a diagram illustrating a configuration of a communication system according to a second embodiment.

FIG. 10 is a diagram illustrating a configuration of a communication system according to a second embodiment.

Transmission and reception devices 50A and 50B forming a communication system according to the second embodiment each include the PI according to the first embodiment. The transmission and reception device 50A is a transmission and reception device at a master side and includes a PLL circuit 51, a clock transmission circuit 52, a data transmission circuit 53, a clock phase interpolator 54, and a data reception circuit 55. The transmission and reception device 50B is a transmission and reception device at a slave side and includes a clock reception circuit 56, a PLL circuit 57, a clock phase interpolator 58, a data reception circuit 59, and a data transmission circuit 60.

The transmission and reception device 50A transmits data from the data transmission circuit 53 in synchronization with a transmission clock generated in the PLL circuit 51 and transmits a transmission clock from the clock transmission circuit 52. The transmission and reception device 50B reproduces, on the basis of the clock received by the clock reception circuit 56, a clock having the same frequency as that of the transmission clock in the PLL circuit 57. Note that there may be cases where the transmission clock output by the clock transmission circuit 52 is not used and, in such a case, the clock transmission circuit 52 and the clock reception circuit 56 are not provided.

The PLL circuit 57 supplies four-phase clocks CLK_0, CLK_90, CLK_180, and CLK_270, which have the same frequency as that of the transmission clock or a frequency obtained by multiplying the frequency of the transmission clock and a reference clock PLL_CLK obtained by diving the frequency to the clock phase interpolator 58.

The clock phase interpolator 58 is the PI circuit according to the first embodiment, generates an interpolated clock on the basis of the four-phase clocks having the same frequency as that of the transmission clock or the frequency obtained by multiplying the frequency, and performs band adjustment on the basis of the reference clock PLL_CLK, as appropriate. A PI code used for generating an interpolated clock is generated by a clock phase detection circuit (not illustrated) that detects a known optimal phase of a data signal and is supplied to the clock phase interpolator 58.

The data reception circuit 59 takes in transmission data in synchronization with the interpolated clock generated by the clock phase interpolator 58.

As described above, in the communication system according to the second embodiment, the PLL circuit 57 performs operations up to the operation of generating a reception clock having the same frequency as that of the transmission clock or the frequency obtained by multiplying the frequency, but does not perform the subsequent operation of phase adjustment of the reception clock, and the phase adjustment is performed by the clock phase interpolator 58.

When data is transmitted from the transmission and reception device 50B to the transmission and reception device 50A, the same configuration as that described above may be symmetrically provided to the transmission and reception device 50B and the transmission and reception device 50A to perform the data transmission. However, in the second embodiment, the data transmission circuit 60 of the transmission and reception device 50B transmits data in synchronization with a clock having the same frequency as that of a transmission clock reproduced in the PLL circuit or a clock having a frequency obtained by multiplying the frequency. In the transmission and reception device 50A, the PLL circuit 51 supplies four-phase clocks of the transmission clock and a reference clock to the clock phase interpolator 54. When the data transmission circuit 60 transmits a repeated data pattern of 1010, the frequency of the four-phase clocks supplied from the PLL circuit 51 to the clock phase interpolator 54 is the same as the frequency of the transmission data.

The clock phase interpolator 54 is the PI circuit according to the first embodiment generates an interpolated clock on the basis of the four-phase clocks of the transmission clock, and performs band adjustment on the basis of the reference clock, as appropriate. Similar to the foregoing, a PI code used for generating an interpolated clock is generated by a clock phase detection circuit (not illustrated) that detects a known optimal phase of a data signal and is supplied to the clock phase interpolator 54.

The data reception circuit 55 takes in transmission data from the data transmission circuit 60 in synchronization with the interpolated clock generated by the clock phase interpolator 54.

In the communication system according to the second embodiment, a single data communication path is provided, but multiple channels may be provided. In such a case, a plurality of data transmission circuits is provided at a transmission side, and a plurality pairs of a clock phase interpolator (PI) and the data reception circuit are provided at the reception side. In this case, as compared to a configuration in which a PLL circuit is provided for each channel, the circuit size may be reduced.

Moreover, when there are variations in characteristics of the plurality of data transmission circuits at the transmission side, a PI may be provided so as to correspond to each of the plurality of data transmission circuits, and each clock phase of transmission data may be adjusted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A clock phase interpolator comprising:
    a phase interpolation processing circuit configured to generate an interpolated clock signal, a phase of which is interpolated from a plurality of operation clock signals having different phases;
    a band adjustment element coupled to the phase interpolation processing circuit, and configured to adjust an operational frequency band of the phase interpolation processing circuit by changing a setting value of the band adjustment element; and
    a control circuit coupled to the phase interpolation processing circuit, and configured to detect a transition state for a reference clock signal of the interpolated clock signal, and configured to control the setting value of the band adjustment element based on the detected transition state, wherein:
    the band adjustment element comprises a plurality of different types of adjustment elements; and
    the control circuit is further configured to change an order of the plurality of different types of adjustment elements to be a control target.

2. The clock phase interpolator according to claim 1, wherein the adjustment elements each comprise a variable capacitor connected to a clock buffer for a band adjustment at an output of the clock buffer.

3. A clock phase interpolator comprising:
    a phase interpolation processing circuit configured to generate an interpolated clock signal, a phase of which is interpolated from a plurality of operation clock signals having different phases;
    a band adjustment element coupled to the phase interpolation processing circuit, and configured to adjust an operational frequency band of the phase interpolation processing circuit by changing a setting value of the band adjustment element; and
    a control circuit coupled to the phase interpolation processing circuit, and configured to detect a transition state for a reference clock signal of the interpolated clock signal, and configured to control the setting value of the band adjustment element based on the detected transition state; and
    a frequency dividing circuit configured to frequency-divide the interpolated clock signal such that the interpolated clock signal has a frequency close to that of the reference clock signal, thereby generating a frequency-divided interpolated clock signal,
    wherein the frequency of the frequency-divided interpolated clock signal is a half of the frequency of the reference clock signal.

4. The clock phase interpolator according to claim 1, wherein the control circuit is configured to determine, as an appropriate state, a state in which a number of times of continuous occurrence of an alternating change of values obtained by latching the frequency-divided interpolated clock signal in accordance with the reference clock signal is equal to or greater than a predetermined number, and to control the setting value of the band adjustment element to be a value at which the appropriate state is achieved.

5. A data transmission and reception circuit comprising:
    a clock generation circuit configured to generate a plurality of operation clock signals having different phases and a reference clock signal;
    a phase interpolation processing circuit configured to generate an interpolated clock signal, a phase of which is interpolated from the plurality of operation clock signals;
    a band adjustment element coupled to the phase interpolation processing circuit, and configured to adjust an operational frequency band of the phase interpolation processing circuit by changing a setting value of the band adjustment element;
    a control circuit coupled to the phase interpolation processing circuit, and configured to detect a transition state for a reference clock signal of the interpolated clock signal, and configured to control the setting value of the band adjustment element based the detected transition state;
    a data transmission and reception unit configured to perform, on based the interpolated clock signal, one or more of transmission and reception of data,
    a plurality of data transmission and reception sections; and
    a plurality of clock phase interpolators corresponding to the plurality of the data transmission and reception sections,
    wherein:
    the plurality of clock phase interpolators is configured to receive the plurality of operation clock signals having different phases and the reference clock signal commonly supplied from the clock generation circuit, and
    the plurality of clock phase interpolators is configured to set a linearity for interpolation processing.

6. The clock phase interpolator according to claim 1, wherein the band adjustment element is further configured to adjust the operational frequency band of the phase interpolation processing circuit by changing the setting value of the band adjustment element based on the reference clock signal.

7. The clock phase interpolator according to claim 2, wherein the adjustment elements further comprise a variable load resistance.

8. The clock phase interpolator according to claim 1, wherein the plurality of operation clock signals are further configured to have a frequency of a transmission clock signal or a frequency obtained by multiplying the frequency of the transmission clock signal and the reference clock signal.

* * * * *